United States Patent [19]

Tamino

[11] Patent Number: 5,264,809
[45] Date of Patent: Nov. 23, 1993

[54] OSCILLATOR CIRCUIT AND PROXIMITY SWITCH USING

[75] Inventor: Shinya Tamino, Kusatsu, Japan
[73] Assignee: Omron Corporation, Kyoto, Japan
[21] Appl. No.: 959,926
[22] Filed: Oct. 14, 1992
[30] Foreign Application Priority Data Oct. 15, 1991 [JP] Japan .................. 3-296202

[51] Int. Cl.⁵ .................. H03K 3/023; H03K 17/95
[52] U.S. Cl. .................. 331/65; 331/74; 331/151
[58] Field of Search .......... 331/65, 74, 143, 151; 324/236, 237, 327

[56] References Cited

U.S. PATENT DOCUMENTS 5,012,206  4/1991  Tigges ........................... 331/65
5,034,704  7/1991  Tomioka et al. ............... 331/65

FOREIGN PATENT DOCUMENTS 50-14749  5/1970  Japan .
53-30672  6/1974  Japan .
55-72329  1/1978  Japan .

Primary Examiner—David Mis
Attorney, Agent, or Firm—Foley & Lardner

[57] ABSTRACT

A proximity switch which can detect any metal with equal changing rate of oscillating frequency, regardless of what kind of metal it may be (magnetic or nonmagnetic), is disclosed. The invention employs a series circuit consisting of a resistor and a first capacitor connected to the output side of a comparator. A detector coil and a second capacitor are connected in parallel to the first capacitor. By selecting appropriate capacitance and resistance values for these components, it can be insured that the change in oscillating frequency corresponding to the distance of an approaching object will be very nearly be identical regardless of the type of metal of which the object is constituted. An embodiment employing a frequency to voltage converter is also disclosed. The arrangement provides continuous detection also suitable for use in range indicator and self diagnosis applications.

19 Claims, 7 Drawing Sheets

OSCILLATOR CIRCUIT AND PROXIMITY SWITCH USING

FIELD OF THE INVENTION

This invention concerns a proximity switch using high frequency oscillation to detect an object which may consist of any type of metal, and the oscillator circuit employed in this switch.

BACKGROUND OF THE INVENTION

Existing Technology

In the conventional proximity switch using high frequency oscillation, oscillation of a fixed frequency is produced by an oscillator circuit which contains an oscillator coil. When a metallic object approaches, eddy current loss causes a change in the conductance of a detector coil. The signal level in the oscillator circuit will decrease, or oscillation will cease entirely. By detecting this change in the signal level, one can detect the proximity of an object. The sensitivity of this detection scheme is good with respect to magnetic metals such as iron, which generate a substantial eddy current loss; but it is lower for non-magnetic metals such as aluminum, which cause only a slight eddy current loss. There has thus been a demand for a proximity switch capable of detecting any metal. Such a switch would have a fixed sensitivity regardless of the composition of the object to be detected, that is to say, regardless of what type of metal the object was composed of.

A proximity switch which can detect any metal is described in Japanese Patent Kokai-Koho 55-72329. The oscillator circuit has a feedback circuit which is tuned to a frequency higher than that of the resonant circuit, producing a high impedance. A magnetic metal is detected using eddy current loss according to the commonly applied principle. A non-magnetic metal is detected via a change in oscillating frequency, which is obtained by detecting the decrease in feedback signal strength with a filter.

Another example is given in Japanese Utility Model Koukoku-Koho 53-30672. Two coils are used, one functioning in a detector circuit and the other in a reference circuit. A magnetic object is detected when oscillation ceases as a result of the drop in the Q of the detector circuit. A non-magnetic object is detected when oscillation ceases because the change in impedance causes there to be a large difference between the oscillating frequency of the detector circuit and the resonant frequency of the reference circuit.

Yet another type of proximity switch is described in Japanese Patent Koukoku-Koho 50-14749. This switch features a parallel resonant circuit with a series resonant circuit magnetically coupled to it. When viewed from the parallel circuit side, the impedance characteristics are double-humped, and the attenuation characteristics of the output are consequently fixed regardless of the type of metal being detected.

These proximity switches, which are capable of detecting any type of metal, all require a number of coils, so it is difficult to downsize them. In addition, if the characteristics of these coils do not allow them to remain in a fixed relationship with each other, it becomes impossible to achieve stable output characteristics. In the real world, there are great variations in the characteristics of components, and inductance and other parameters vary with temperature, resulting in poor stability. The necessity of using more than one coil complicates the design and makes the switch more difficult to adjust. It also makes it more difficult to lower the cost.

SUMMARY OF THE INVENTION

In view of the problems of the proximity switches described above, an object of this invention is to provide a switch which can detect both magnetic and non-magnetic metals with the same sensitivity using a single coil.

In a first embodiment an oscillator circuit has a switching circuit which switches the output when the input crosses a threshold value, a series circuit with a resistor R1 and a capacitor C1, on the output side of the switching circuit, connected between the output and the ground terminal, and a series circuit with a detector coil L and a capacitor C2, which is connected in parallel to the aforementioned capacitor C1. The capacitance of capacitors C1 and C2 and the resistance of resistor R1 are chosen so that the change in oscillating frequency is fixed regardless of what type of metal object is approaching.

A second embodiment of the invention has an oscillator circuit of he type described in the first embodiment, as well as a signal processing circuit which detects the distance of an object by means of the change in oscillating frequency of the oscillator circuit.

According to the oscillator circuit described in the first embodiment, the oscillating frequency will vary with the distance to an object regardless of what metal it contains by setting values of resistor R1 and capacitors C1 and C2 during oscillation.

The proximity switch described in the second embodiment will detect how far away an object is by measuring a change in the oscillating frequency.

BRIEF DESCRIPTION OF THE DRAWINGS

The invention will be described in detail with reference to the drawings in which:

FIGS. 1 (a), (b) and (c) are circuit diagrams illustrating the basic configuration of an oscillator circuit of the first embodiment.

FIG. 2 (a) is an equivalent circuit for the oscillator coil and the object to be detected.

FIG. 4 (a) is a graph showing the value of $R_x$ vs. distance

DETAILED DESCRIPTION OF THE PREFERRED EMBODIMENTS

Figure 2A:
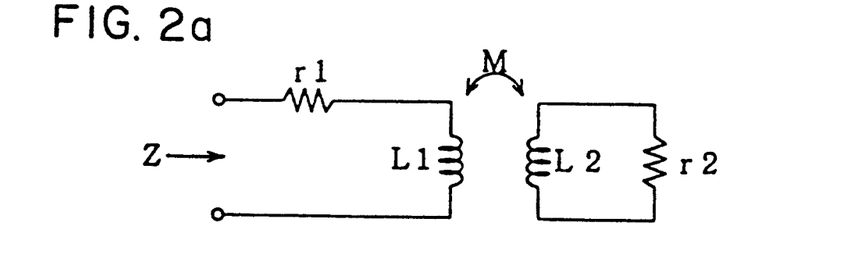

A principle which underlies this invention is illustrated in FIG. 2 (a) which shows an equivalent circuit for oscillator coil L in the oscillator circuit. Oscillator coil L has inductance $L_1$ and DC resistance $r_1$. When an object approaches the vicinity of the oscillator coil L, the effect of its proximity is a response equivalent to what would occur in the presence of coil $L_2$ and DC resistor $r_2$. Calling the mutual inductance M, the impedance Z as seen from both terminals of the oscillator coil is given by:

$$Z = r1 + \frac{M^2}{\frac{r2^2}{\omega^2} + L2^2} r2 + \quad (1)$$

$$j\omega \left( L1 - \frac{M^2}{\frac{r^2}{\omega^2} + L2^2} L2 \right) = Rx + j\omega L_x$$

Figure 2B:
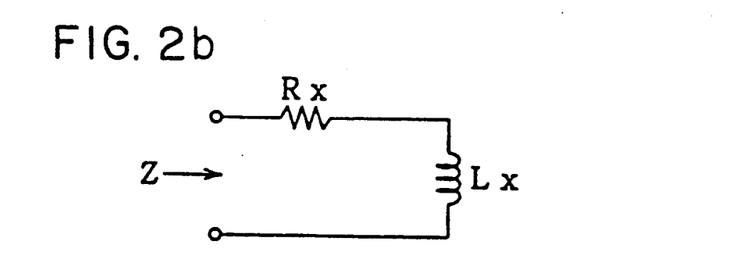
FIG. 2(b) is an equivalent circuit containing these to explain the principle of this invention.

If, for the sake of convenience, Equation 1 is divided into a real number portion and an imaginary number portion using the symbols $R_x$ and $L_x$, the two terminals of the coil are indicated equivalently as shown in FIG. 2 (b) The invention uses this characteristic in its design so that the change in oscillating frequency of the oscillator circuit is the same regardless of whether the approaching object is made of a magnetic or non-magnetic metal.

Figure 1A:
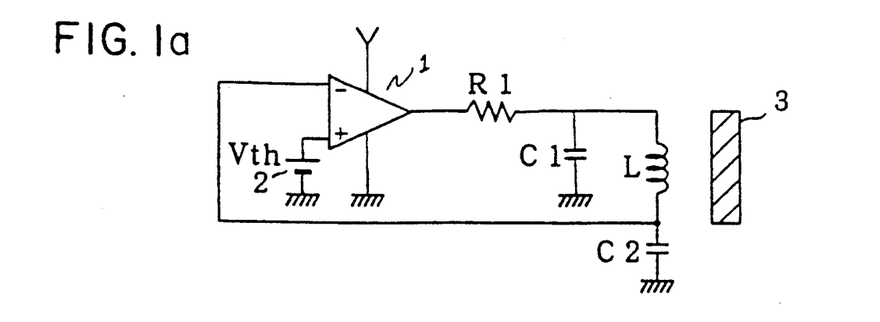
Figure 1B:
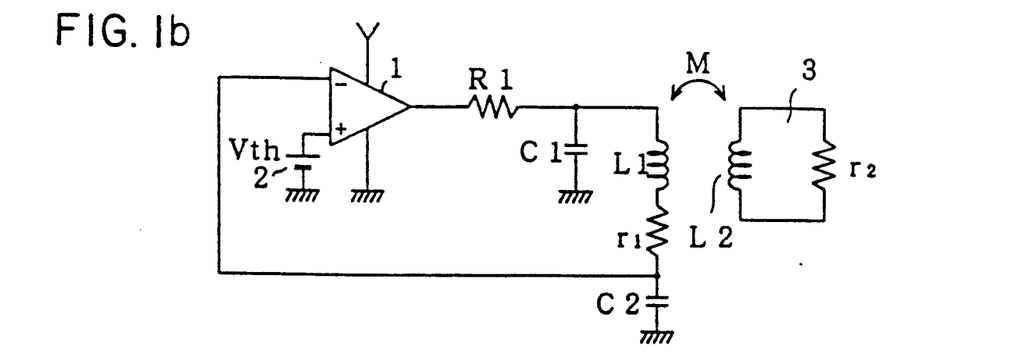
FIG. 1(b) is a diagram of an equivalent circuit for the object which is approaching.
Figure 1C:
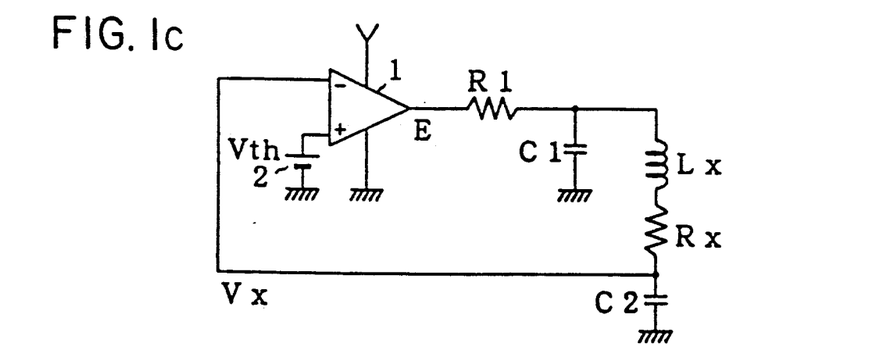
FIG. 1(c) is a diagram of an equivalent circuit for the oscillator circuit which contains the equivalent circuit shown in FIG. 1(b).

FIG. 1 (a) is a schematic diagram illustrating the basic structure of this invention. FIG. 1(a) shows a comparator or switching circuit Reference power supply 2, which supplies voltage $V_{th}$, is connected to the non-inverting input terminal of the comparator 1. The output of comparator 1 returns to ground through the series connection of resistor $R_1$ and capacitor $C_1$. The midpoint of this network returns to ground through the series connection of oscillator coil L and capacitor $C_2$. The midpoint between oscillator coil L and capacitor $C_2$ is connected to the inverting input terminal of comparator 1. As can be seen in FIG. 1 (b), when object 3 approaches, oscillator coil L functions just as in FIG. 2 (a). The effects on $L_1$, $r_1$ of object 3 are represented by inductance $L_2$ and resistance $r_2$. This being the case, the effect of object 3 is represented as shown in FIG. 1 (c), as was discussed above with respect to FIGS. 2a and 2b.

Comparator 1 is a switching circuit which outputs a high or low level signal. This can be represented by switch 4 in the equivalent circuit in FIG. 3.

Figure 3:
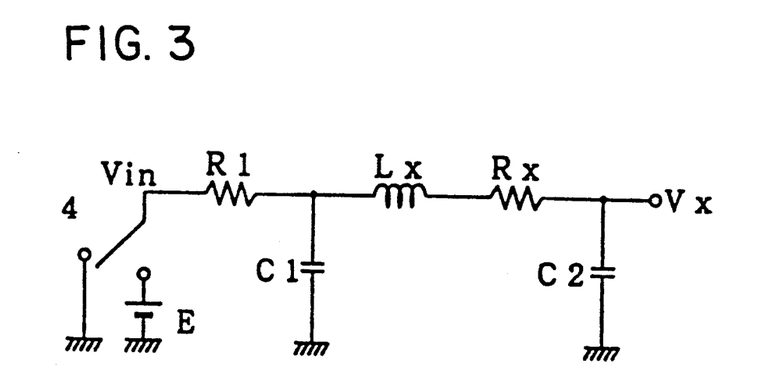
FIG. 3 is a circuit diagram showing the basic configuration of an oscillator circuit to be used in this first embodiment.

Assume that the terminal of resistor $R_1$ can be connected at the user's discretion to either the ground or a power supply with voltage E, and call the output voltage $V_x$ from what becomes the common connection terminal of resistor $R_x$ and capacitor $C_2$. $V_{in}$ can then be expressed as follows.

When $V_x \geq V_{th}$, $V_{in} = 0$

When $V_x < V_{th}$, $V_{in} = E$

Calling the charges of capacitors $C_1$ and $C_2$, $q_1$ and $q_2$ respectively, then the following formula will obtained.

$$V_x = \frac{1}{C2} q_2 \quad (2)$$

$$\frac{1}{C1} q_1 = L_x \frac{d^2 q_2}{dt^2} + R_x \frac{dq_2}{dt} + V_x \quad (3)$$

$$V_{in} = \left( \frac{dq_1}{dt} + \frac{dq_2}{dt} \right) R1 + \frac{1}{C1} q_1 \quad (4)$$

Expressing, this using a Laplace transform element S, obtains the following:

When $V_{in} = E$, $\quad (5)$
$E/S = [1 + C_1 R_1 S + C_2 R_1 S + C_2 S (1 + R_1 C_1 S) (L_x S + R_x)] V_x$ When $V_{in} = 0$, $\quad (6)$
$0 = [1 + C_1 R_1 S + C_2 R_1 S + C_2 S (1 + R_1 C_1 S) (L_x S + R_x)] V_x$ Using these formulas, the characteristic equation F (S) can be expressed as follows.

$$F(S) = R_1 C_1 C_2 L_x S^3 + (R_1 C_1 C_2 R_x + C_2 L_x) S^2 + \quad (7)$$
$$(C_2 R_x + C_1 R_1 + C_2 R_1) S + 1$$

Using this characteristic equation, the oscillating frequency $\omega_{osc}$ can be expressed by the following formula.

$$\omega_{osc}2 = \frac{C_2 R_x + C_1 R_1 + C_2 R_1}{R_1 C_1 C_2 L_x} \quad (8)$$

$$= \frac{C_1 + C_2}{C_1 C_2 L_x} + \frac{R_x}{C_1 R_1 L_x}$$

Thus the oscillating frequency f can be expressed as Formula (9).

$$f = \frac{1}{2\pi} \sqrt{\frac{C_1 + C_2}{C_1 C_2 L_x} + \frac{R_x}{C_1 R_1 L_x}} \quad (9)$$

$L_x$ is in the denominator in Formula (9), and $R_x$ is in the numerator. When a magnetic metal approaches, the oscillating frequency will increase because of the increase in $R_x$; when a non-magnetic metal approaches, the frequency will increase because of the decrease in $L_x$. By choosing the values of resistor $R_1$ and capacitors $C_1$ and $C_2$, or adjusting said values by known adjustment means, we can adjust the ratio of the first and second terms in Formula (6) so that the changing rate of the oscillating frequency is identical for the approach of magnetic and non-magnetic metals.

Figure 4A:
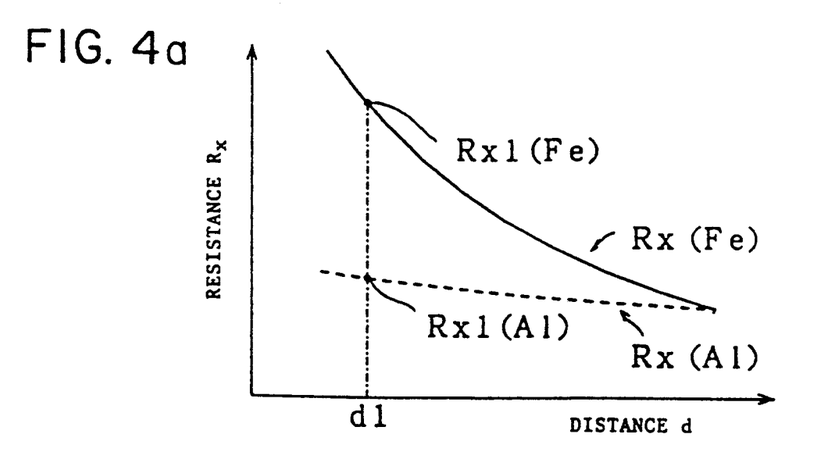
Figure 4B:
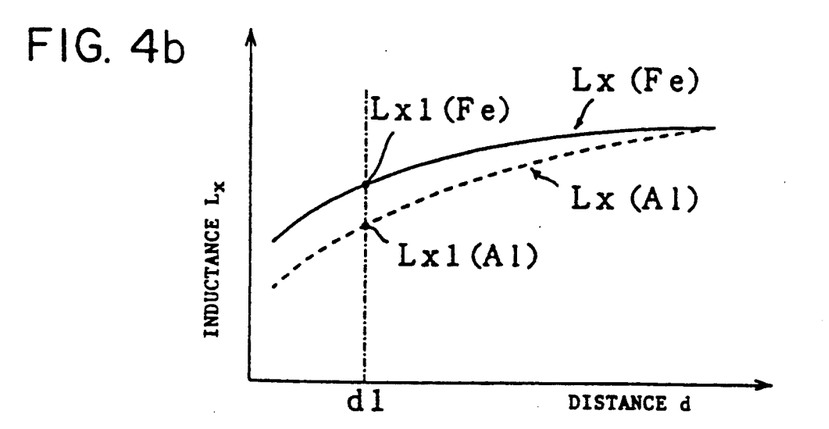
FIG. 4(b) shows how $L_x$ varies with distance.

FIGS. 4 (a) and (b) graphically illustrate how resistance $R_x$ and inductance $L_x$ vary with the distance, d, for a magnetic metal (iron) and a non-magnetic metal (aluminum). As can be seen in the graphs, the resistance and inductance both vary as exponential functions, differing only in their coefficients for the different materials. The values of capacitors $C_1$ and $C_2$ and resistor $R_1$ are determined as follows. Capacitors $C_1$ and $C_2$ and corresponding oscillator coil L form the oscillator circuit of the proximity switch. They are selected so as to provide a suitable oscillating frequency. Call the resistance value for iron at a specified distance, $d_1$, $R_{x1}$ (Fe), and that for aluminum $R_{x1}$ (Al). Then call the inductance for iron at the same distance $L_{x1}$ (Fe) and that for aluminum $L_{x1}$ (Al). A frequency equivalent to the oscillating frequency at this time can be obtained by employing Formula 10.

$$\frac{C_1 + C_2}{C_1 C_2 L_{x1} \text{ (Fe)}} + \frac{R_{x1} \text{ (Fe)}}{C_1 R_1 L_{x1} \text{ (Fe)}} = \qquad (10)$$

$$\frac{C_1 + C_2}{C_1 C_2 L_{x1} \text{ (Al)}} + \frac{R_{x1} \text{ (Al)}}{C_1 R_1 L_{x1} \text{ (Al)}}$$

Figure 5:
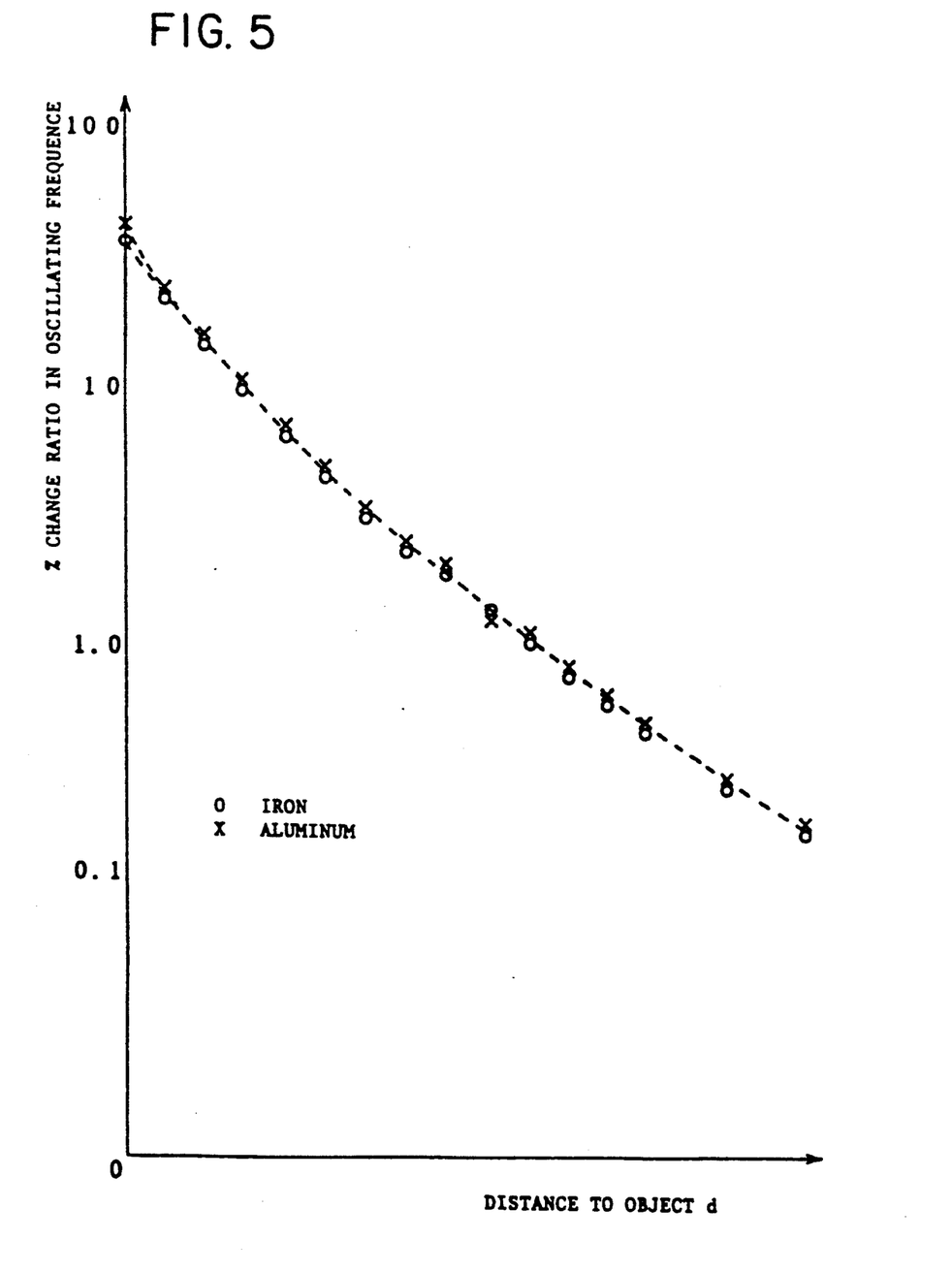
FIG. 5 is a graph showing the rate of change of oscillating frequency with respect to distance in this example.

When $C_1$, $C_2$ and $R_1$ are selected so as to satisfy this formula, it can be seen that the oscillating frequencies are equal. When $C_1$ and $C_2$ are determined by the oscillating frequency, the equation can be solved for $R_1$. This value can then be used as the value of resistor $R_1$. The inductance and resistance in the presence of magnetic and non-magnetic metals are equal at an infinite distance, which will cause the oscillating frequencies associated with them to coincide. The oscillating frequencies at a distance, $d_1$, are made to coincide. There are thus two points at which the rates of change of the oscillating frequency corresponding to a change in the distance of the object will coincide. As can be seen in FIG. 4, the dependencies of resistance $R_x$ and inductance $L_x$ on distance for the different materials differ only in their coefficients. This is illustrated by the rates of change of the very similarly shaped exponential curves shown in FIGS. 4a and 4b. Thus the rate of change of the oscillating frequency would virtually coincide for the different materials for any distance beyond $d_1$. This has been confirmed experimentally, and the characteristics shown in FIG. 5 have been obtained. In this graph, the rate of change of oscillating frequency is plotted with respect to the distance of a magnetic object (iron), represented by $\bigcirc$, and a non-magnetic object (aluminum), represented by x.

The equation can be solved in the same fashion as Formula (10) for distances other than $d_1$, say $d_2$ and $d_3$, and the values for capacitors $C_1$ and $C_2$ and resistor $R_1$ can be determined by simultaneous equations. In this way the characteristics can be made to coincide perfectly. However, this scheme does not allow the user to freely choose an oscillating frequency, which suggests that it would not be appropriate for a proximity switch. For this reason, we have chosen an example in which Formula (10) is established for one specified distance $d_1$. Appropriate values for $C_1$ and $C_2$ are selected, and an oscillating frequency is chosen. The characteristic rates of change of oscillating frequency corresponding to different types of metals are made to be very similar.

Figure 6:
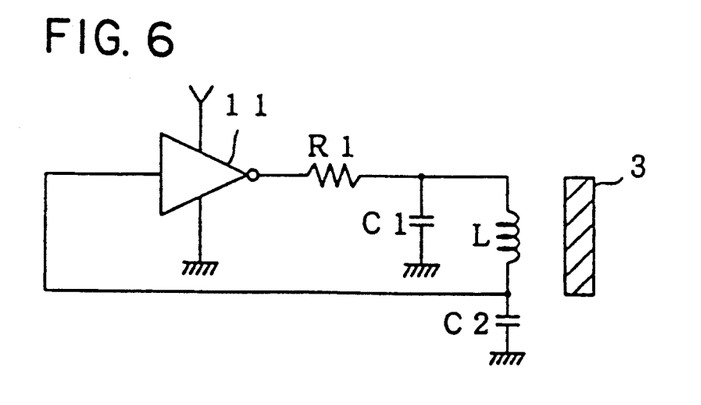
FIG. 6 is a second circuit diagram of the oscillator circuit in this first embodiment.

FIG. 6 is a second circuit diagram of an oscillator circuit which might be used in the first embodiment. In this example, inverter 11 is used in place of the comparator 1 in the first example described above. As previously explained resistor $R_1$, capacitor $C_1$, output coil L and capacitor $C_2$, are connected on the output side of inverter 11 replacing comparator 1, are identical with those described in the first example. It would also be possible in this example to use an inverting amplifier with a high amplification factor in place of inverter 11. The input signal would be discriminated at a specified threshold and the output inverted. Thus the switching signals would be the outputs of the respective switching circuits.

Figure 7:
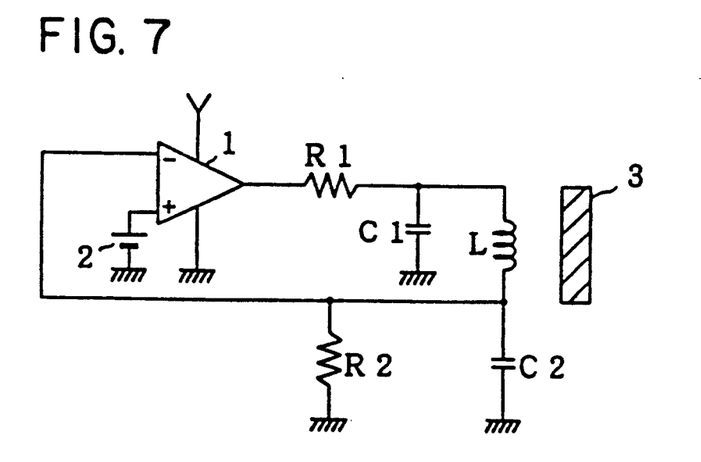
FIG. 7 is a third circuit diagram of the oscillator circuit in this first embodiment.

FIG. 7 is a third circuit diagram of another oscillator circuit which can be used in the first embodiment. In this example, as can be seen in the diagram, resistor $R_2$ is connected in parallel with capacitor $C_2$. In this case, the oscillating frequency can be obtained from Formula (11) given below.

$$f = \frac{1}{2\pi} \sqrt{\frac{(R_1 C_1 + R_2 C_2) R_x + L_x + (C_1 + C_2) R_1 R_2}{R_1 R_2 C_1 C_2 L_x}} \qquad (11)$$

$$= \frac{1}{2\pi} \sqrt{\frac{(R_1 C_1 + R_2 C_2) R_x}{R_1 R_2 C_1 C_2 L_x} + \frac{(C_1 + C_2)}{C_1 C_2 L_x} + \frac{1}{R_1 R_2 C_1 C_2}}$$

In Formula (11), the third term of the square root is unrelated to $L_x$ and $R_x$. As a result, the oscillating frequency f can be adjusted to the desired frequency by choosing an appropriate resistance value for resistor $R_2$. In this case, too, it would be possible to substitute an inverter or inverting amplifier with a high amplification factor for comparator 1.

Figure 8:
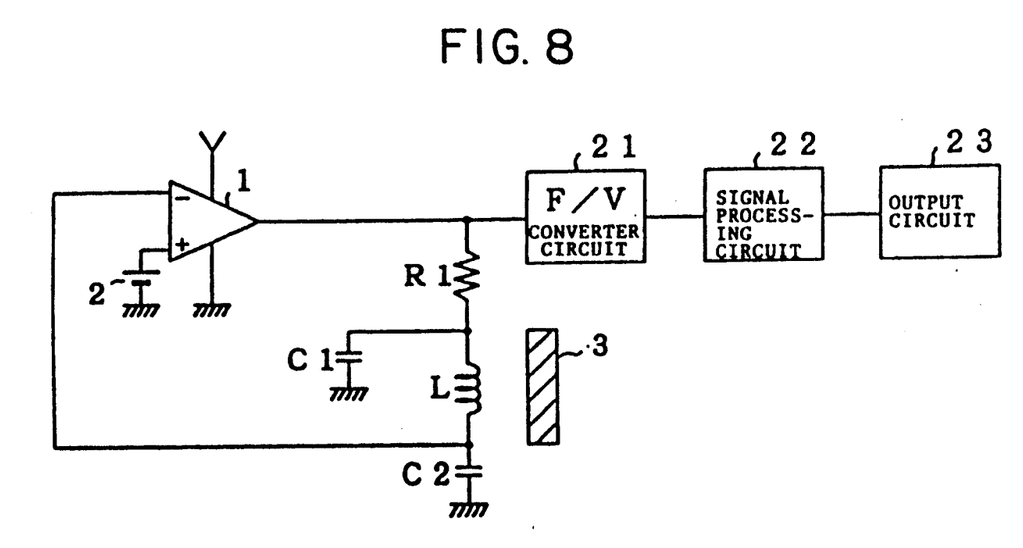
FIG. 8 is a first block diagram of a proximity switch according to the second embodiment based on high frequency oscillation which uses the oscillator circuit described in the first embodiment.

FIG. 8 is a first block diagram illustrating the structure of one possible proximity switch according to a second embodiment, based on, for example, high frequency oscillation which employs the oscillator circuit described in the first embodiment. The frequency of the oscillator circuit described as the first embodiment herein can be monitored at any convenient point in the circuit. In this switch, the output of comparator 1 is supplied to resistor $R_1$ and connected to frequency to voltage (F/V) converter circuit 21. Circuit 21 converts the frequency of its input signal to voltage. Its output is transmitted to signal processing circuit 22, which determines the distance of the object according to the graph in FIG. 5, which was discussed above. This determination is based on a comparison of the voltage signal when no object is proximate to the voltage when an object is proximate. The output of signal processing circuit 22 is monitored and transmitted for use to an exterior circuit by way of output circuit 23. For circuit 22, a non-linear output circuit could be used; or the distance signals could be stored in a memory, e.g. a ROM table, and then output.

A proximity switch using an oscillator circuit will not have intermittent oscillation, but will produce a signal whose frequency varies continuously in correspondence with the distance at which the object is detected. One could establish the optimal detection range for the distance from the proximity switch to the object and add on a self-diagnostic feature, which would output a warning signal when the object was outside this range.

Figure 9:
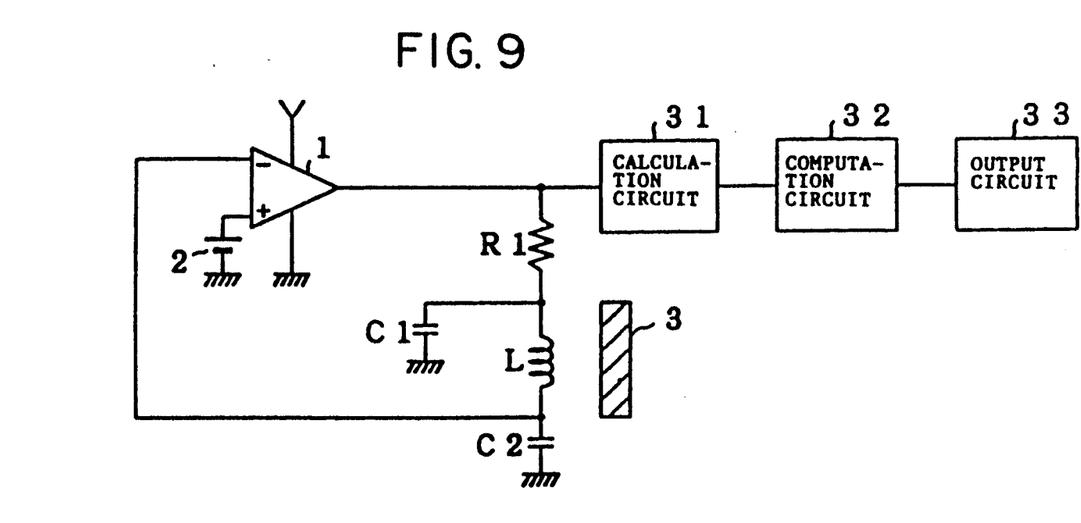
FIG. 9 is a second block diagram showing another high frequency oscillation-type proximity switch of the second embodiment using the oscillator circuit described in the first embodiment.

FIG. 9 is a block diagram illustrating another example of a proximity switch based on high frequency oscillation which employs the oscillator circuit described in the first example. In this switch, the output terminal of comparator 1 is added to resistor $R_1$ and connected to calculation circuit 31. Circuit 31 calculates the number of pulses associated with the oscillating frequency. Its output is transmitted to computation circuit 32, which outputs the distance of the object based on a comparison of the ordinary oscillating frequency with that when an object is proximate. The resulting signal is output for use by an exterior circuit by way of output circuit 33.

As has been explained in detail in the preceding discussion, this invention features an extremely simple configuration which enables it to detect, with identical changing rate of oscillating frequency, both magnetic and non-magnetic metals. Furthermore, the fact that it employs only a single oscillator coil insures that it can be adjusted easily and is capable of achieving a high level of stability.

This invention does not employ the switching on and off of oscillation at a threshold, as in conventional oscillator circuits. Rather, the frequency varies continuously with the distance of the object to be detected. Thus, one could easily incorporate in the output circuit or add on a self-diagnosing feature to limit the detection zone of the oscillator circuit.

While several embodiments of the invention have been described, it will be understood that it is capable of further modifications, and this application is intended to cover any variations, uses, or adaptations of the invention, following in general the principles of the invention and including such departures from the present disclosure as to come within knowledge or customary practice in the art to which the invention pertains, and as may be applied to the essential features hereinbefore set forth and falling within the scope of the invention or the limits of the appended claims.

What is claimed is:

1. An oscillator circuit comprising:
    a switching circuit having an output which switches when an input to said switching circuit crosses a threshold value;
    a first series circuit with a resistor R1 and a capacitor C1, said first series circuit being connected between said output and a ground terminal;
    a second series circuit with a detector coil L and a capacitor C2, said second series circuit being connected in parallel to said capacitor C1; and
    wherein a capacitance of said capacitors C1 and C2 and a resistance of said resistor R1 are selected so that a ratio of change in oscillating frequency of said oscillator circuit as a function of distance from said oscillating circuit to an object is constant regardless of the type of metal of said object.

2. A proximity switch comprising:
    a switching circuit having an output which switches when an input to said switching circuit crosses a threshold value;
    a first series circuit with a resistor R1 and a capacitor C1, said first series circuit being connected between said output of said switching circuit and a ground terminal;
    a second series circuit with a detector coil L and a capacitor C2, said second series circuit being connected in parallel to said capacitor C1; and
    wherein a capacitance of said capacitors C1 and C2 and a resistance of said resistor R1 are selected so that a ratio of change in oscillating frequency of said oscillator circuit is constant regardless of the type of metal of said object to be detected.

3. The apparatus recited in claim 2, further comprising a signal processing circuit which detects distance to said object by means of said change ratio in said oscillating frequency of said oscillator circuit.

4. The apparatus recited in claim 1, wherein said input to said switching circuit is connected between said detector coil and said capacitor C2.

5. The apparatus recited in claim 2, wherein said input to said switching circuit is connected between said detector coil and said capacitor C2.

6. The apparatus recited in claim 1, wherein said resistor and said first and second capacitors are adjustable.

7. The apparatus recited in claim 2, wherein said resistor and said first and second capacitors are adjustable.

8. A proximity switch comprising:
    a detector coil;
    an oscillator responsive to said detector coil to produce oscillations having a frequency variable with a distance between said proximity switch and an object to be detected, and wherein said oscillator produces approximately the same change in said frequency for magnetic and non-magnetic ones of said objects to be detected.

9. The apparatus recited in claim 8, wherein said oscillator includes said detector coil.

10. The apparatus recited in claim 8, wherein said oscillator comprises:
    a threshold circuit having an input connected to a first side of said detector coil, and an output connected through a series resistor to a second side of said detector coil;
    a first capacitor connected between said first side of said detector coil and ground; and
    a second capacitor connected between said second side of said detector coil and ground, wherein the value of said series resistor and said first and second capacitors cause said oscillator to produce said approximately said same change in said frequency.

11. The apparatus recited in claim 10, wherein said first and second capacitor values and an inductance value of said detector coil set said frequency of oscillation at a predetermined distance from said object to be detected and wherein said values and a value of said series resistor results in said approximately said same change in frequency.

12. The apparatus recited in claim 11, wherein said approximately said change in frequency exists at distances of said object greater than or equal to said predetermined distance.

13. The apparatus recited in claim 10, further comprising a parallel resistor connected in parallel with said second capacitor, said parallel resistor providing adjustment of said frequency.

14. The apparatus recited in claim 10, wherein said resistor and said capacitors are adjustable.

15. The apparatus recited in claim 8, further comprising a frequency to voltage converter receiving an output from said oscillator.

16. The apparatus recited in claim 15, further comprising means for monitoring said voltage produced by said voltage to frequency converter.

17. A method of forming a proximity detector for detecting both magnetic and non-magnetic materials. The method comprising the steps of:
    routing a first side of a detector coil to an input of a threshold responsive switching circuit and an output of said switching circuit to a second side of said detector coil through a series resistor;
    placing a first capacitor between said first side of said detector coil and ground and a second capacitor between said second side of said detector coil and ground, thereby forming an oscillator; and
    selecting values of said resistor, detector coil and said capacitors such that a frequency variable with a distance between an object to be detected and said detector, varies by approximately the same amount for magnetic and non-magnetic objects to be detected.

18. A method of detecting proximity of magnetic and non-magnetic objects to a proximity detector the method comprising the steps of:
    bringing said objects toward a same proximity detector, said proximity detector having a detector coil and an oscillator responsive to said detector coil to produce oscillations at a frequency variable with a distance between said proximity detector and said object, and wherein said oscillator produces approximately a same change in said frequency for magnetic and non-magnetic objects to be detected.

19. A method of forming a proximity detector, the method comprising the steps of:

locating a detector coil in an oscillator responsive to said detector coil to produce oscillations having a frequency variable with a distance between said proximity detector and an object to be detected, wherein said oscillator produces approximately the same change in frequency for magnetic and non-magnetic objects to be detected.

* * * * *